United States Patent
Arling

(10) Patent No.: US 9,754,480 B2
(45) Date of Patent: Sep. 5, 2017

(54) SYSTEM AND METHOD FOR CONTROLLING DEVICE LOCATION DETERMINATION

(71) Applicant: Universal Electronics Inc., Santa Ana, CA (US)

(72) Inventor: Paul D. Arling, Irvine, CA (US)

(73) Assignee: Universal Electronics Inc., Santa Ana, CA (US)

(*) Notice: Subject to any disclaimer, the term of this patent is extended or adjusted under 35 U.S.C. 154(b) by 79 days.

(21) Appl. No.: 14/496,753

(22) Filed: Sep. 25, 2014

(65) Prior Publication Data

US 2015/0010167 A1  Jan. 8, 2015

Related U.S. Application Data

(60) Continuation-in-part of application No. 14/077,844, filed on Nov. 12, 2013, which is a continuation of
(Continued)

(51) Int. Cl.
*H04R 9/06* (2006.01)
*G08C 17/02* (2006.01)
(Continued)

(52) U.S. Cl.
CPC .............. *G08C 17/02* (2013.01); *G05B 15/02* (2013.01); *G08C 23/04* (2013.01); *H03G 1/02* (2013.01);
(Continued)

(58) Field of Classification Search
CPC ........ G08C 17/02; G08C 23/04; G08C 15/02; G08C 2201/91; G08C 2201/92;
(Continued)

(56) References Cited

U.S. PATENT DOCUMENTS 4,904,993 A   2/1990 Sato
5,101,191 A   3/1992 MacFadyen et al.
(Continued)

FOREIGN PATENT DOCUMENTS

WO    91/07838    5/1991

OTHER PUBLICATIONS

European Patent Office, Communication issued on European patent application No. 04810230.5, dated Jan. 21, 2010, 3 pages.
(Continued)

*Primary Examiner* — Leshui Zhang
(74) *Attorney, Agent, or Firm* — Greenberg Traurig, LLP

(57) ABSTRACT

A controlling device such as a remote control has programming for transmitting a signal response to a plurality of control environments, each environment including a signaling device. Each signaling device in receipt of the signal request sends a signal response having a unique ID which is chosen to be characteristically attenuated by the surroundings of the environment. Because the controlling device can only be in one environment at a given time, and given the attenuation characteristics of the signal response from each signaling device, only one signal response will be received by the controlling device in each environment. Location definitions associated with the received unique ID may be used by programming in the controlling device to recall saved devices states, commands sets, macros, and even to dynamically generate commands based on the location information.

9 Claims, 9 Drawing Sheets

Related U.S. Application Data application No. 13/396,178, filed on Feb. 14, 2012, now Pat. No. 8,712,352, which is a continuation of application No. 13/004,529, filed on Jan. 11, 2011, now Pat. No. 8,180,373, which is a division of application No. 12/020,747, filed on Jan. 28, 2008, now Pat. No. 8,059,621, which is a continuation of application No. 10/978,971, filed on Nov. 1, 2004, now Pat. No. 7,363,028.

(60) Provisional application No. 60/517,558, filed on Nov. 4, 2003.

(51) Int. Cl.

| | | |
|---|---|---|
| *H03G 1/02* | (2006.01) | |
| *G05B 15/02* | (2006.01) | |
| *G08C 23/04* | (2006.01) | |
| *H04N 21/41* | (2011.01) | |
| *H04W 4/04* | (2009.01) | |
| *H04N 21/422* | (2011.01) | |
| *H04N 21/436* | (2011.01) | |
| *H04L 12/28* | (2006.01) | |
| *H04W 64/00* | (2009.01) | |

(52) U.S. Cl.
CPC ....... *H04L 12/282* (2013.01); *H04N 21/4126* (2013.01); *H04N 21/42226* (2013.01); *H04N 21/43615* (2013.01); *H04W 4/04* (2013.01); *G08C 2201/91* (2013.01); *G08C 2201/92* (2013.01); *G08C 2201/93* (2013.01); *H04L 12/281* (2013.01); *H04L 2012/2849* (2013.01); *H04M 2242/30* (2013.01); *H04W 64/00* (2013.01)

(58) Field of Classification Search
CPC .... G08C 2201/93; H03G 1/02; H04L 12/282; H04L 12/281; H04L 2012/2849; H04N 21/4126; H04N 21/42226; H04N 21/43615; H04N 5/44; H04N 5/60; H04N 2005/4405; H04N 2005/4407; H04N 2005/4408; H04N 2005/441; H04N 2005/4412; H04N 2005/4414; H04W 4/04; H04W 64/00; H04M 2242/30; H04R 9/06; G06F 3/16; H03J 2200/22; H03J 2200/23; H03J 2200/24; H03J 2200/25; H03J 2200/26
USPC ... 381/1, 17, 18, 300–307, 314, 315, 82, 85, 381/86, 89, 332, 333, 334, 111, 116, 117, 381/118, 123, 150; 348/734, 738, 348/E05.122, E05.096; 715/727; 700/94
See application file for complete search history.

(56) References Cited

U.S. PATENT DOCUMENTS

| | | |
|---|---|---|
| 5,109,222 A | 4/1992 | Welty |
| 5,552,806 A | 9/1996 | Lenchik |
| 5,642,303 A | 6/1997 | Small et al. |
| 5,764,786 A | 6/1998 | Kuwashima et al. |
| 5,767,919 A | 6/1998 | Lee et al. |
| 6,029,209 A | 2/2000 | Cornaby et al. |
| 6,151,490 A | 11/2000 | Schultheiss |
| 6,346,891 B1* | 2/2002 | Feinleib .......... G08C 17/02 340/12.3 |
| 6,400,956 B1* | 6/2002 | Richton .......... H04W 4/02 340/988 |
| 6,400,968 B1 | 6/2002 | White et al. |
| 6,563,430 B1 | 5/2003 | Kemink et al. |
| 6,580,704 B1 | 6/2003 | Wellig et al. |
| 6,753,790 B2 | 6/2004 | Davies et al. |
| 6,791,467 B1 | 9/2004 | Ben-Ze'ev |
| 6,792,323 B2 | 9/2004 | Krzyzanowski et al. |
| 6,812,881 B1 | 11/2004 | Mullaly et al. |
| 6,850,252 B1 | 2/2005 | Hoffberg |
| 6,885,362 B2 | 4/2005 | Suomela |
| 6,909,891 B2 | 6/2005 | Yamashita et al. |
| 7,139,562 B2 | 11/2006 | Matsui |
| 7,363,028 B2 | 4/2008 | De Clerq et al. |
| 2001/0038328 A1 | 11/2001 | King et al. |
| 2002/0127994 A1 | 9/2002 | Stanners |
| 2003/0061606 A1 | 3/2003 | Hartwig et al. |
| 2003/0076240 A1 | 4/2003 | Bae et al. |
| 2003/0142641 A1 | 7/2003 | Sumner et al. |
| 2003/0189509 A1 | 10/2003 | Hayes et al. |
| 2004/0017934 A1 | 1/2004 | Kocher |
| 2004/0027495 A1 | 2/2004 | Ferris |
| 2004/0061621 A1 | 4/2004 | Ishida |
| 2004/0067736 A1 | 4/2004 | Kamma |
| 2004/0163073 A1 | 8/2004 | Krzyzanowski et al. |
| 2004/0266419 A1 | 12/2004 | Arling et al. |
| 2005/0035846 A1 | 2/2005 | Zigmond et al. |
| 2005/0076242 A1 | 4/2005 | Breuer |
| 2005/0249169 A1 | 11/2005 | Fong |
| 2008/0278635 A1* | 11/2008 | Hardacker ........ H04N 5/44582 348/734 |
| 2010/0053466 A1* | 3/2010 | Naka ................ H04N 5/4403 348/734 |
| 2012/0027226 A1* | 2/2012 | Desenberg ............ H04N 7/15 381/105 |
| 2013/0331087 A1 | 12/2013 | Shoemaker et al. |

OTHER PUBLICATIONS

ISA/US, International Search Report and Written Opinion issued on PCT application No. US15/51198, dated Dec. 15, 2015, 11 pages.

\* cited by examiner

SYSTEM AND METHOD FOR CONTROLLING DEVICE LOCATION DETERMINATION

RELATED APPLICATION INFORMATION

This application claims the benefit of and is a continuation-in-part of U.S. application Ser. No. 14/077,844, filed on Nov. 12, 2013, which application claims the benefit of and is a continuation of U.S. application Ser. No. 13/396,178, filed on Feb. 14, 2012, which application claims the benefit of and is a continuation of U.S. application Ser. No. 13/004,529, filed on Jan. 11, 2011, which application claims the benefit of and is a divisional of U.S. application Ser. No. 12/020,747, filed on Jan. 28, 2008, which application claims the benefit of and is a continuation of U.S. application Ser. No. 10/978,971, filed on Nov. 11, 2004, which application claims the benefit of U.S. Provisional Patent Application No. 60/517,558, filed on Nov. 4, 2003, which applications are incorporated herein by reference in their entirety.

BACKGROUND

The following relates generally to portable devices such as wireless controlling device systems and, more particularly, relates to a system and method for determining the location or relative environment of a portable controlling device.

Various systems and methods for providing location based information in electronic devices are known, specifically for reporting the location of a portable device within an environment, or for determining in which of several possible environments a portable device is located. For instance, the active badge system developed by Olivetti uses a mobile infrared (IR) transmitter (badge) and specialized fixed IR receivers to determine the location of any person or object to which a particular badge is affixed. U.S. Pat. No. 5,642,303 also describes a location based computing system wherein one or more specialized radio frequency (RF) beacons transmitting a unique signal are placed in desired locations such that a portable computing system having an RF receiver may detect the unique signal when it is within a specified range and determine its location.

While the active badge system and the system described in U.S. Pat. No. 5,642,303 perform adequately when simple location based determinations are desired, what is needed is a more precise location based computing system that functions to discern a specific location from among multiple sensed locations in order to enable more advanced location based functions. In particular, more precise location information is required for portable controlling devices that incorporate location based services and functions in order to quickly enable operation of desired appliances at any given time.

Accordingly, it is desired to provide a system and method that functions to accurately determine the location of a controlling device from among multiple control locations, environments, or zones. Additionally, it is further desired to provide a location determination method and system which may take advantage of transmission and/or reception devices already placed into an environment for other purposes.

SUMMARY

In accordance with these needs and desires, a controlling device location determination system and method is described.

Generally, the system includes a controlling device (such as a wireless, universal remote control), one or more location signaling devices, and multiple control environments, each control environment including home appliances operable by the controlling device. Control environments may be further segmented into control zones in one embodiment of the present invention. In one exemplary system, a location signaling device is placed within each control environment in order to send one or more signals to a controlling device for location determination operations. Various methods for determining the location of the controlling device relative to the various control environments and zones, or similarly determining the proximity of various home appliances to the controlling device are disclosed, as well as methods for using determined location information to dynamically reconfigure default command set and/or macro commands on the controlling device to control a desired appliance or multi-appliance function. More specifically, the exemplary system includes as its controlling device a wireless, universal remote control with access to preconfigured location definitions and/or dynamically generated location based data, and programming for detecting and comparing received signal data to determine its location or the proximity of certain appliances within multiple control environments and/or zones. Additional programming available to the controlling device enables controlling device states, command sets, and/or macro commands to be recalled or dynamically reconfigured for a given device or group of devices using the location definition data and/or dynamically generated location based data.

A better understanding of the objects, advantages, features, properties and relationships of the subject system and method will be obtained from the following detailed description and accompanying drawings which set forth illustrative embodiments which are indicative of the various ways in which the principles of the system and method may be employed.

BRIEF DESCRIPTION OF THE DRAWINGS

For a better understanding of the system and method described hereinafter, reference may be had to preferred embodiments shown in the following drawings in which.

DETAILED DESCRIPTION

Figure 1:
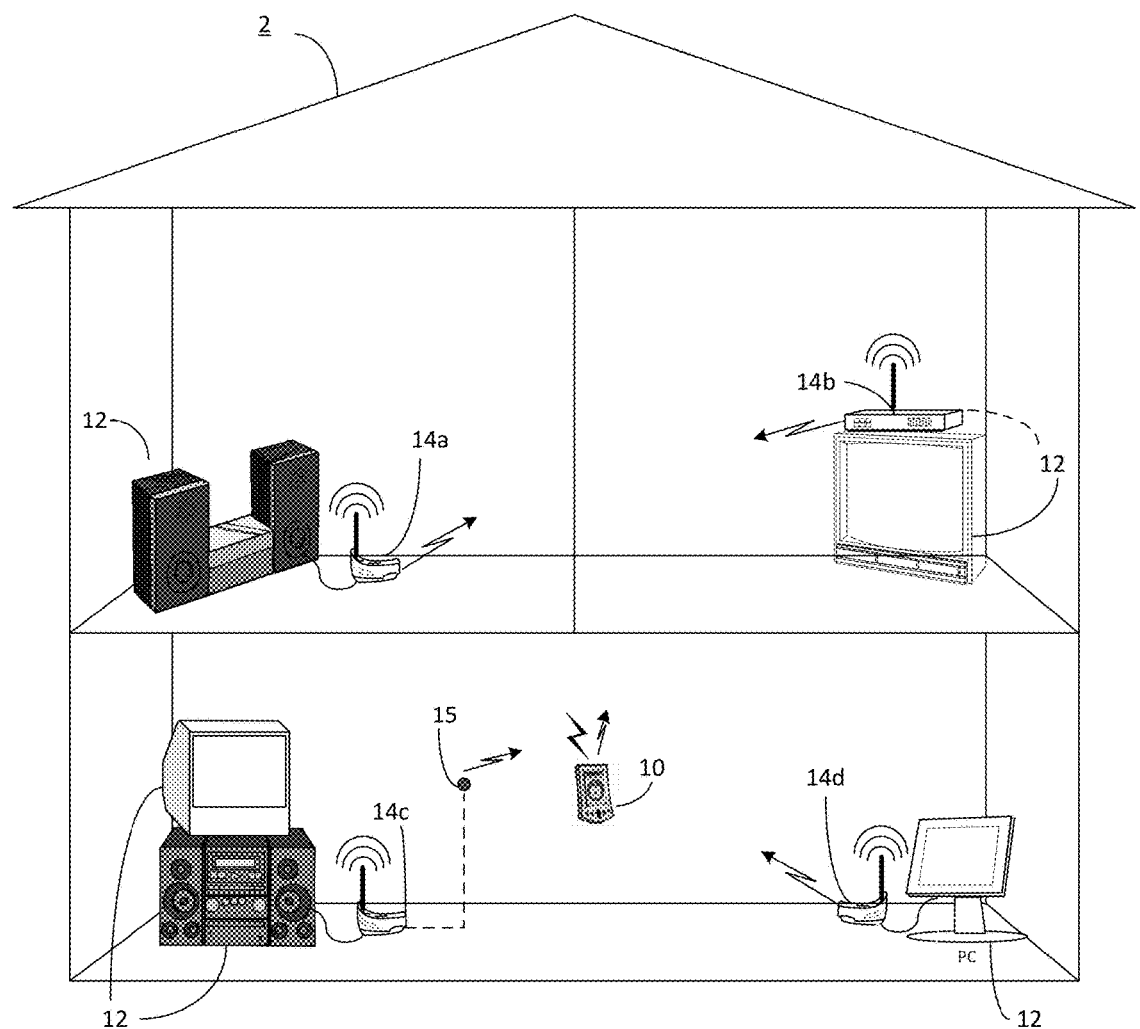
FIG. 1 illustrates an exemplary system employing a method for determining controlling device location.

With reference to the figures, a system and method is described for determining the location, environment, or zone of a controlling device at a given time. To this end, a system is described which generally includes a controlling device 10 (e.g., a wireless, universal remote control) that is adapted to transmit location determination signals (e.g., a signal request) as well as command codes to control the operation of one or more home appliances 12 as is illustrated in FIG. 1. By way of example only, the appliances 12 can include, but are not limited to, televisions, VCRs, DVRs, DVD players, cable converter boxes, amplifiers, CD players, game consoles, home lighting, drapery, fans, HVAC systems, thermostats, personal computers, etc.

Figure 2:
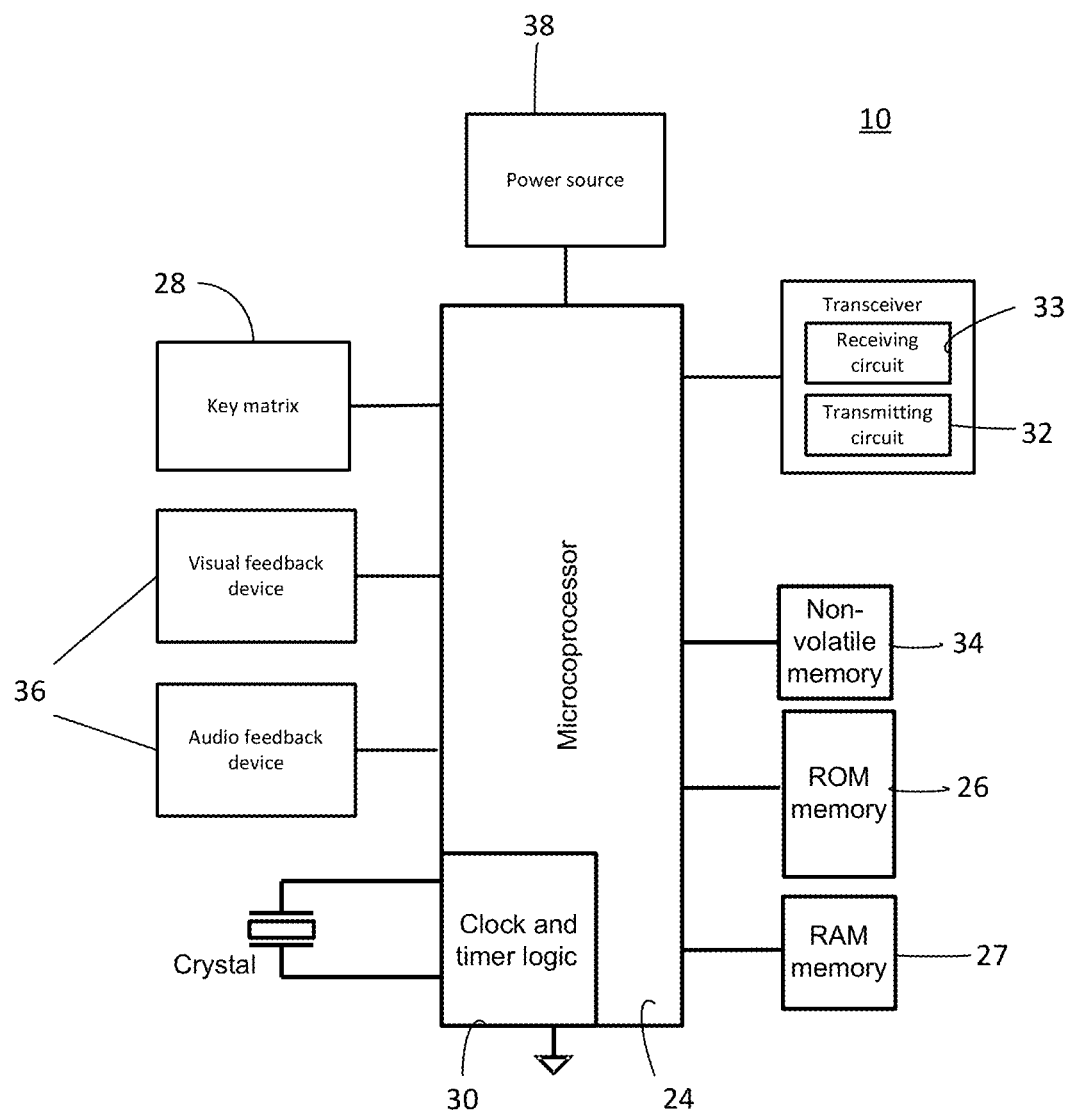
FIG. 2 illustrates a block diagram of components of an exemplary controlling device.

For use in transmitting command codes to one or more of the appliances 12, the controlling device 10 of the exemplary system may include, as needed for a particular application, a processor 24 coupled to a memory device (such as ROM memory 26, RAM memory 27, and a non-volatile memory 34), a key matrix 28 (e.g., physical buttons, a touch screen display, or a combination thereof), an internal clock and timer 30, transmission circuit(s) 32, receiver circuit(s) 33, and/or transceiver circuit(s) (e.g., IR and/or RF), a means 36 to provide feedback to the user (e.g., LED, display, speaker, and/or the like), and a power supply 38 as generally illustrated in FIG. 2. As will be understood by those of skill in the art, the memory device may include executable instructions that are intended to be executed by the processor 24 to control the operation of the controlling device 10. In this manner, the processor 24 may be programmed to control the various electronic components within the controlling device 10, e.g., to monitor the power supply 38, to cause the transmission of signals, etc.

The non-volatile read/write memory 34, for example an EEPROM, battery-backed up RAM, Smart Card, memory stick, or the like, may be provided to store setup data and parameters as necessary. It is to be additionally understood that the memory devices may take the form of any type of readable media, such as, for example, ROM, RAM, SRAM, FLASH, EEPROM, Smart Card, memory stick, a chip, a hard disk, a magnetic disk, and/or an optical disk. Still further, it will be appreciated that some or all of the illustrated memory devices 26, 27, and 34 may be physically incorporated within the same IC chip as the microprocessor 24 (a so called "microcontroller") and, as such, they are shown separately in FIG. 2 only for the sake of clarity.

To identify home appliances by type and make (and sometimes model) such that the controlling device 10 is adapted to transmit recognizable command codes in the format appropriate for such identified appliances 12, data may be entered into the controlling device 10. Since methods for setting up a controlling device to control the operation of specific home appliances are well-known, such methods need not be described in greater detail herein. Nevertheless, for additional information pertaining to controlling device setup, the reader may turn to U.S. Pat. Nos. 4,959,810, 5,614,906, and 6,225,938. It will also be appreciated that the controlling device 10 may be set up to control an appliance 12 by being taught the command codes needed to control such appliance as described in U.S. Pat. No. 4,623,887.

To cause the controlling device 10 to perform an action, the controlling device 10 is adapted to be responsive to events, such as a sensed user interaction with the key matrix 28, receipt of a data or signal transmission, etc. In response to an event, appropriate instructions within the memory 26 may be executed. For example, when a command key is activated on the controlling device 10, the controlling device 10 may retrieve a command code corresponding to the activated command key from memory 26 and transmit the command code to a device in a format recognizable by the device. It will be appreciated that the instructions within the memory 26 can be used not only to cause the transmission of command codes and/or data to the appliances 12 but also to perform local operations, e.g., location based features and functions a described in greater detail below. While not limiting, other local operations that may be performed by the controlling device 10 include displaying information/data, favorite channel setup, macro button setup, function key relocation, etc. Examples of these latter mentioned local operations can be found in U.S. Pat. Nos. 5,481,256, 5,959, 751, and 6,014,092. Additional examples of controlling devices 10 may be found in commonly owned, U.S. Pat. No. 6,225,938 and U.S. application Ser. Nos. 60/264,767, 09/905,423, 09/905,432, and 09/905,396.

In keeping with the subject system and method, the controlling device 10 preferably includes programming such that the location of the controlling device may be determined by one or more signals detected by the remote. Given a determination of relative location, controlling device 10 may further include programming whereby command sets (i.e., device command codes mapped to various buttons of key matrix 28), controlling device states, favorite channel line-ups, and/or macro commands are recalled from memory, made available from a home computer or Internet based data source, and/or dynamically generated (based on location data) such that desired commands or functions are presented to a user automatically. The methods for such automated command set recall and/or generation are described more fully in commonly assigned, co-pending U.S. Provisional Application 60/517,283 entitled "Home Appliance Control System and Methods in a Networked Environment". Additional extended control functions may be implemented in conjunction with the current system and method, such as the ability to pause and resume appliance states across multiple control environments or zones, which is described more fully in commonly assigned, co-pending U.S. Application 60/517,737 entitled "System And Method For Saving And Recalling State Data For Media And Home Appliances".

Figure 3:
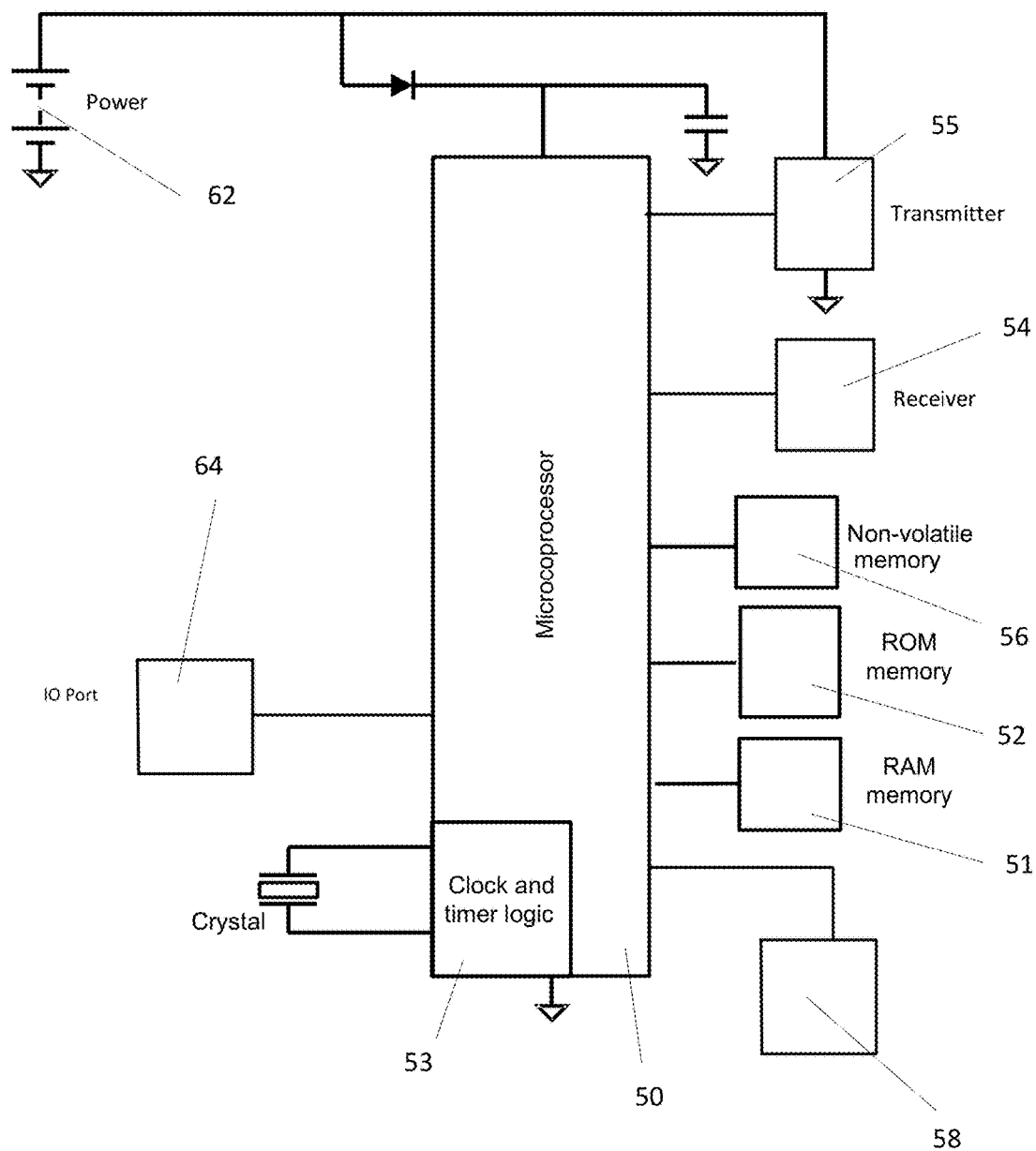
FIG. 3 illustrates a block diagram of components of an exemplary location signaling device.

For use in providing location data to controlling device 10, one exemplary system and method includes one or more signaling devices 14. The signaling device(s) 14 may be a device (e.g., 14a) separate and apart from the appliances 12 or may be integrated (e.g., 14b) into one or more of the appliances 12 as is illustrated in FIG. 1. Signaling device 14 may additionally be integrated with other extended function control devices such as the command receiver described in commonly assigned, co-pending U.S. patent application Ser. No. 10/603,839 entitled "System And Method For Monitoring Controlling device Transmissions." In any of these cases, the signaling device 14 may include, as needed for a particular application, a processor 50 coupled to a memory device (such as RAM memory 51, ROM memory 52, and/or non-volatile read/write memory 56), an internal clock and timer 53, receiver circuit(s) 54, transmission circuit(s) 55, and/or transceiver circuit(s) (e.g., IR and/or RF), a non-volatile read/write memory 56, a means 58 to provide feedback to the user (e.g., LED, display, speaker, and/or the like), a power supply 62, and input means 64, (e.g., serial I/O port, Ethernet, 1394 firewire, wireless receiver, bar code scanner, etc.), as is generally illustrated in FIG. 3. The input means 64 may be used to connect each signaling device 14 to a common home control unit (such as a control pod, server, HVAC, etc.) in order to enable communication and timing operations between all signaling devices. The memory device may include executable instructions that are intended to be executed by the processor 50 to control the operation of the signaling device 14. In this manner, the processor 50 may be programmed to control the various electronic components within the signaling device 14, e.g., to monitor the power supply 62, to cause the transmission of signals, to provide audio or visual prompts to a user, etc. The non-volatile read/write memory 56, for example an EEPROM, battery-backed up RAM, Smart Card, memory stick, or the like, may also be provided to store setup data and parameters as necessary. While the memory 52 is illustrated and described as a ROM memory, memory 52 can also be comprised of any type of readable media, such as ROM, RAM, SRAM, FLASH, EEPROM, or the like. Preferably, the memory 56 is non-volatile or battery-backed such that data is not required to be reloaded after battery changes. In addition, the memories 51, 52 and/or 56 may take the form of a chip, a hard disk, a magnetic disk, and/or an optical disk. It will also be appreciated that in cases where signaling device capability is integrated into an appliance, some or all of the functional elements described above in conjunction with FIG. 3 may be combined with similar elements already present in the appliance for other purposes.

For transmitting and receiving information between controlling device 10 and the signaling device(s) 14*a*-*d* (as shown in FIG. 1), communication may be performed using an IR protocol such as XMP (described in co-pending U.S. patent application Ser. No. 10/431,930) an RF protocol such as Bluetooth, 802.11, RFID, or any other suitable wireless transmission method. All that is required is that the signaling device 14 be able to decipher a received signal request and that the controlling device 10 be able to decipher a received signal response. For example, controlling device 10 may send a signal request via XMP over IR to signaling device 14*b*, which in turn sends a signal response back to controlling device 10 via XMP over IR. The information (described in greater detail below) sent from signaling device 14*b* to controlling device 10 may then be intelligently used to discern the location or environment of controlling device 10. In one exemplary system, two different signals (such as IR and RF, each communicating via XMP or other wireless transmission protocols) are used in communication between the controlling device 10 and signaling device(s) 14*a*-*d* in order to provide for additional location and environment based determinations and functions. For example, controlling device 10 may send a signal request via RF from anywhere in or around an environment (illustrated in FIG. 1 as a multi-room home or office structure, but may be any environment or location) such that one or more of signaling devices 14*a*-*d* receive the signal. Each signaling device in receipt of the signal request from controlling device 10 includes programming to transmit a signal response, either via IR alone in one example system, via RF alone, or via both IR and RF according to other embodiments. It will be appreciated that if collision avoidance is a necessary part of the transmission format and protocol used, the programming in the signaling devices may include algorithms to cause individual responses to be transmitted in sequential fashion, based for example on ascending device address value, CSMA techniques, token passing between the signaling devices, or other techniques as are well known in the art. The use of RF and IR signals is only to be taken as illustrative of various signals that can be used in conjunction with the current invention, and generally the signals are chosen for their characteristic attenuation in a multi-room location or environment. For example, because RF signals will be attenuated only partially (in most instances) by walls, floors, ceilings and other similar structures (generally solid obstructions), the signal request sent from controlling device 10 may be received by all, or most of signaling devices 14*a*-*d*, while IR signals which are fully attenuated by such similar solid obstructions will (for purposes of the current invention) remain confined to a single room of an environment. By configuring one example system of the current invention to initiate a signal request via RF (or similar signal), and configuring each signaling device in receipt of the signal request to transmit a signal response via IR (or similar signal which is attenuated by solid obstructions), the controlling device 10 will only receive the signal response from a signaling device in the same room (i.e., in an area lacking structures and obstacles that would attenuate the IR signal response). In this connection, it will be appreciated by those skilled in the art that although IR signals are generally thought of as line-of-sight, in fact infrared behaves very much like visible light and may be reflected off light colored walls, glossy surfaces, etc., such that it is generally not necessary for the controlling device 10 to be directly in front of such a signaling device in order to determine which room it is in.

Figure 7:
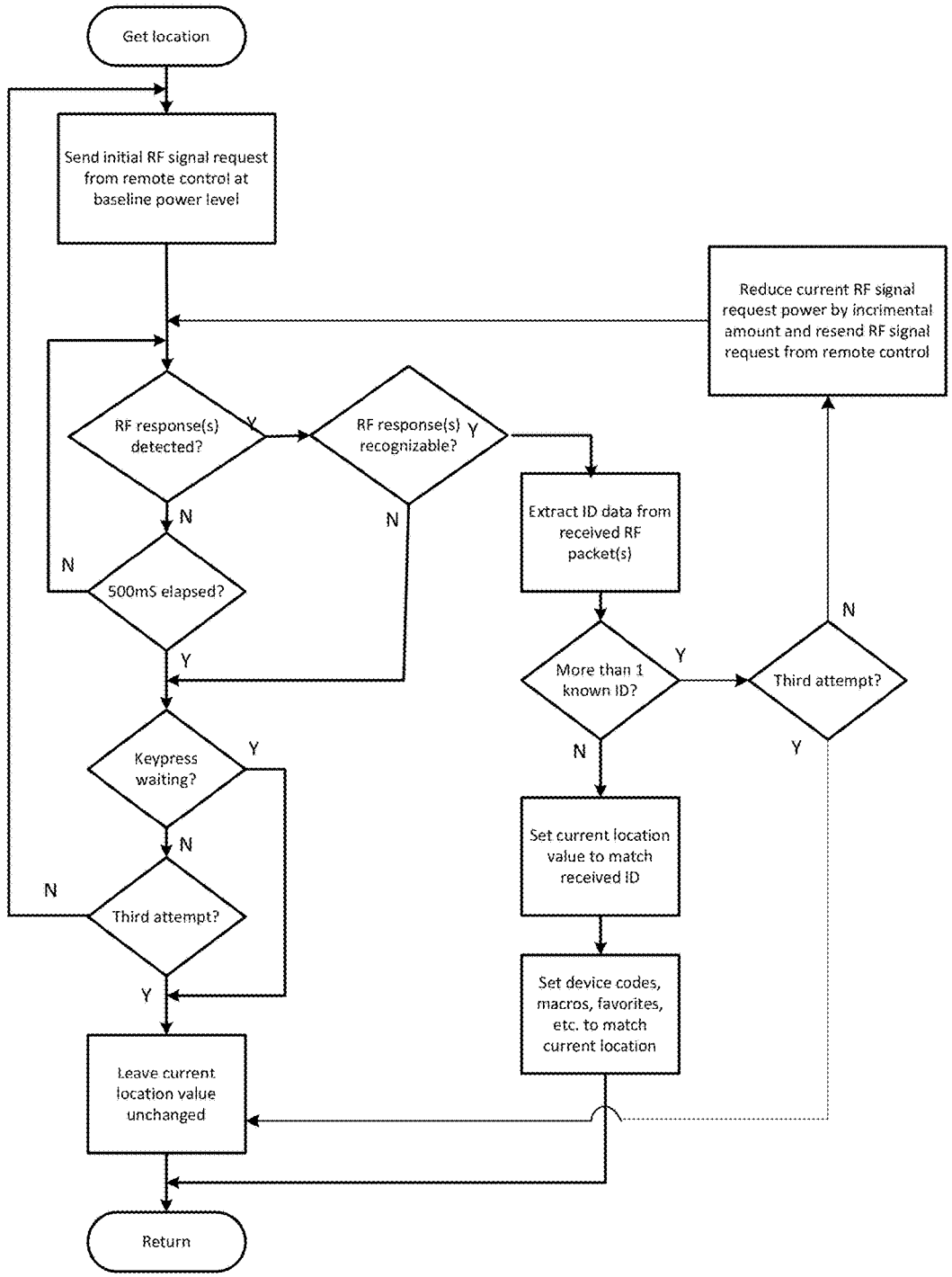
FIG. 7 illustrates a flow chart diagram of an alternate method for determining controlling device position.

In other embodiments, and for enabling additional location and environment based determinations, the system of the present invention may be configured such that each signaling device in receipt of a signal request sends a signal response via RF signals alone, or both via IR and RF signals. In this way the controlling device 10 may intelligently make a determination of a current room location (based on the single received IR signal), and may additionally determine which signaling devices are within the range of RF signals (based on the received RF signal(s)) to enable additional control functions, such as transmitting command data for home appliances to other rooms of an environment via RF signals to one or more signaling devices within range, or directly to appliances associated with a signaling device or location definition, as described in greater detail below. In one alternate embodiment, RF signals of varying strengths (generally decreasing in signal strength) may be sent iteratively by the controlling device to the signaling devices (as illustrated in FIG. 7), or by the signaling devices in response to a signal request from the controlling device (not illustrated) in order to enable location determination functions. It is well known in the art that many selective signal attenuation methods and devices, for example attenuators and filter based devices, may be used in conjunction with the location determination system of the current invention in order to enable incremental signal strength changes as contemplated herein. When combined RF and IR signaling is utilized, the controlling device 10 may use received signals to determine, for example, that an appliance is within RF range (from the receipt of an RF signal from a signaling device 14) but not within the same room or environment (from the failure of receipt of an IR signal from that same signaling device 14) to configure itself according to this determination.

In the example shown in FIG. 7, the controlling device initiates a signal request by sending an initial RF signal having a baseline signal strength. If after receipt of signal response(s) from the signaling device(s) it is determined that two or more signaling devices received the initial RF signal, and thus no definitive location determination can be made, programming on or available to the controlling device causes an incremental decrease in output signal request strength and the process is repeated. In general the controlling device may be configured to iterate the above process a predefined number of times, or until it is determined by programming on or available to the controlling device that only one signaling device received the signal request. In this way location-based determinations may be made by the controlling device and used for further processing and manipulation of functions, and features in the remote and/or control environment. As described above, it will be understood that each signaling device may be configured to respond to successive signal requests from the controlling device by iteratively decreasing the strength of their respective signal response signals such that programming on or available to the controlling device may similarly make location based determinations given the number of received signal responses over a given period of time. Still further, it will be understood that while described in the context of RF based communications, the iterative signal strength reduction methodologies described above may be used in conjunction with IR, and/or mixed IR/RF location determination systems without departing from the spirit and scope of the present invention.

In order to differentiate between signaling devices, the controlling device 10 is equipped to identify a unique characteristic associated with each device. To this end, in one embodiment there is further maintained within each signaling device 14 (for example, stored in the non-volatile read/write memory 56) a unique signaling device ID that serves to distinguish multiple signaling devices from one another. For the purposes of the current invention, such IDs may be globally assigned and preprogrammed at the factory, automatically generated by a system configuration algorithm, entered by a user, programmed via switches, etc. The receipt and recognition of the unique ID(s) by controlling device 10 allow the determination of its location or relative environment, as each unique ID is associated with location definitions accessible to controlling device 10. Controlling device 10 may also be configured to simply recall or generate a state, graphical user interface, command set, command key/command code mapping, macro command, etc. based on the receipt of a particular unique ID. It will be understood that many location and control based determinations, modifications, functions, and features will be possible given the receipt and recognition of unique ID(s) and their associated signaling device, location definition, command set, etc. without departing from the spirit and scope of the present invention.

The unique ID may be in the form of any digital code capable of being modulated on a carrier signal (i.e., RF and/IR signals in conjunction with XMP, Bluetooth, 802.11, or any other wireless protocols in the exemplary system), and for purposes of the present invention, should be of sufficient bit length to accommodate a desired amount of unique IDs for a particular environment. For instance, an 8 bit code would be able to accommodate up to 256 uniquely assignable IDs, however, for error correction, security/encryption, and other functions it may desirable to provide for unique IDs having significantly longer bit lengths (e.g., 64 or 128 bit IDs). Because it is one object of an example system of this present invention to make use of signals of different type in order to effect location based determinations, it may be desirable to utilize unique IDs for each signal type in the signaling device(s), such that the IDs themselves could identity both the particular signaling device, and the particular signal type once received in the controlling device. For example, the RF signal of a particular signaling device may be assigned a first unique ID, while the IR signal of the same signaling device may be assigned a second unique ID, each ID being associated with the same location definition, command set, macro, etc., yet providing immediate information to the controlling device as to which signal type is being received. Alternatively, RF and IR signals may separated in time, e.g., with all signaling devices sending their RF responses in a first time window of pre-defined duration after the controlling device's request signal, followed by their IR responses in a second, subsequent time window.

It will be appreciated that there are many different methods of providing for the controlling devices determination both of a transmitted unique characteristic, and of the signal type on which the unique characteristic was received without departing from the spirit and scope of the present invention. For example, in an alternative embodiment in which the signaling devices are further equipped to receive command requests from other devices and perform IR control operations on appliances located in the vicinity of each signaling device (so called "IR blasters"), the IR signal transmitted in response to a request from controlling device 10 may comprise a simple control command for one or more of the appliances in that room. By way of example only, if a living room contains a Sony TV set and a bedroom a Panasonic TV set, controlling device 10 may determine its current location by issuing an RF request, received by all signaling devices, to increase TV volume by a small amount and monitoring which format IR command transmission from an IR blaster it detects: Sony (known as SIRCS) or Panasonic (known as Kaseikyo.) In an alternative embodiment, the existence of such RF addressable "IR blaster" signaling devices may be taken advantage of by a controlling device 10 equipped with only basic IR receiving ability (e.g., for the purpose of "learning" IR signals) even though that controlling device may not be intrinsically capable of completely decoding and identifying the exact format of a received IR signal as described above: in this instance controlling device 10 may issue individual RF commands sequentially to each signaling device in turn until such time as IR activity of any type is detected. When this IR activity occurs, it may be inferred that the controlling device is located in the same environment as the signaling device just addressed. Additionally, in a UPnP based control environment the unique identifying characteristic (unique ID) for use in location determination may be configured as part of the Uniform Resource Identifiers (URI), or as part of an XML device description document which also contain addressing information for the particular devices or appliances. Accordingly, in the discussions that follow, it is to be understood that the term "ID" is to be interpreted in the widest possible sense, i.e., as comprising any suitable identifying characteristic.

According to another embodiment, each signaling device 14*a-d*, as shown in FIG. 1, includes at least one unique ID for sending to controlling device 10 via IR (or similar signal) in response to the signal request sent by controlling device (generally via RF or similar signal). As will be appreciated, the presence of IR signals from each signaling device 14*a-d* in the various rooms illustrated inside environment 2 will only be detected by controlling device 10 when inside the same room(s) as the IR signals. It will also be appreciated that for signaling devices 14*c* and 14*d* which are configured in the same room, the position, orientation, and relative output IR signal strength from each may be made to affect the ability of controlling device 10 to receive one signal versus the other, thus enabling additional location/orientation determination information for controlling device 10. To this end, for example, upon detection of multiple IR responses to its request signal, the controlling device may repeat the request while reducing the gain of its IR receiver circuit in order to differentiate signals received via direct line of sight versus attenuated signals received via in-room reflective paths. Alternatively, signaling devices 14*a-d* may be configured with a separate compact IR transceiver portion 15 in communication with the base signaling device (14c as illustrated in FIG. 1) such that optimal positioning for signal detection by the controlling device is possible. As will be appreciated, each separate IR transceiver may be in communication with its respective signaling device via wired or wireless means, such that optimal signal detection by controlling device 10 of the IR signal from each compact IR transceiver 15 is possible though user positioning of the IR transceiver 15.

In one example system, each appliance 12 (or set of appliances) connected to or near each signaling device is identified with location definitions accessible to controlling device 10 (either loaded in the memory of controlling device 10 or configured on a separate device such as a home computer, internet accessible data source, or the like) such that the receipt and recognition by controlling device 10 of a unique ID may also identify to controlling device 10 the appliances 12 associated with the signaling device sending the unique ID by reference to the location definitions. The format, storage, and use of location definitions, as well as associated functions and features made possible in controlling devices, are described more fully in co-pending U.S. Provisional Application entitled "Home Appliance Control System and Methods in a Networked Environment" 60/517,283 and "System And Method For Saving And Recalling State Data For Media And Home Appliances" 60/517,237 as well as in U.S. application Ser. No. 10/288,727 "User Interface for a Hand Held Controlling device," all of which are owned by a common assignee.

Figure 6A:
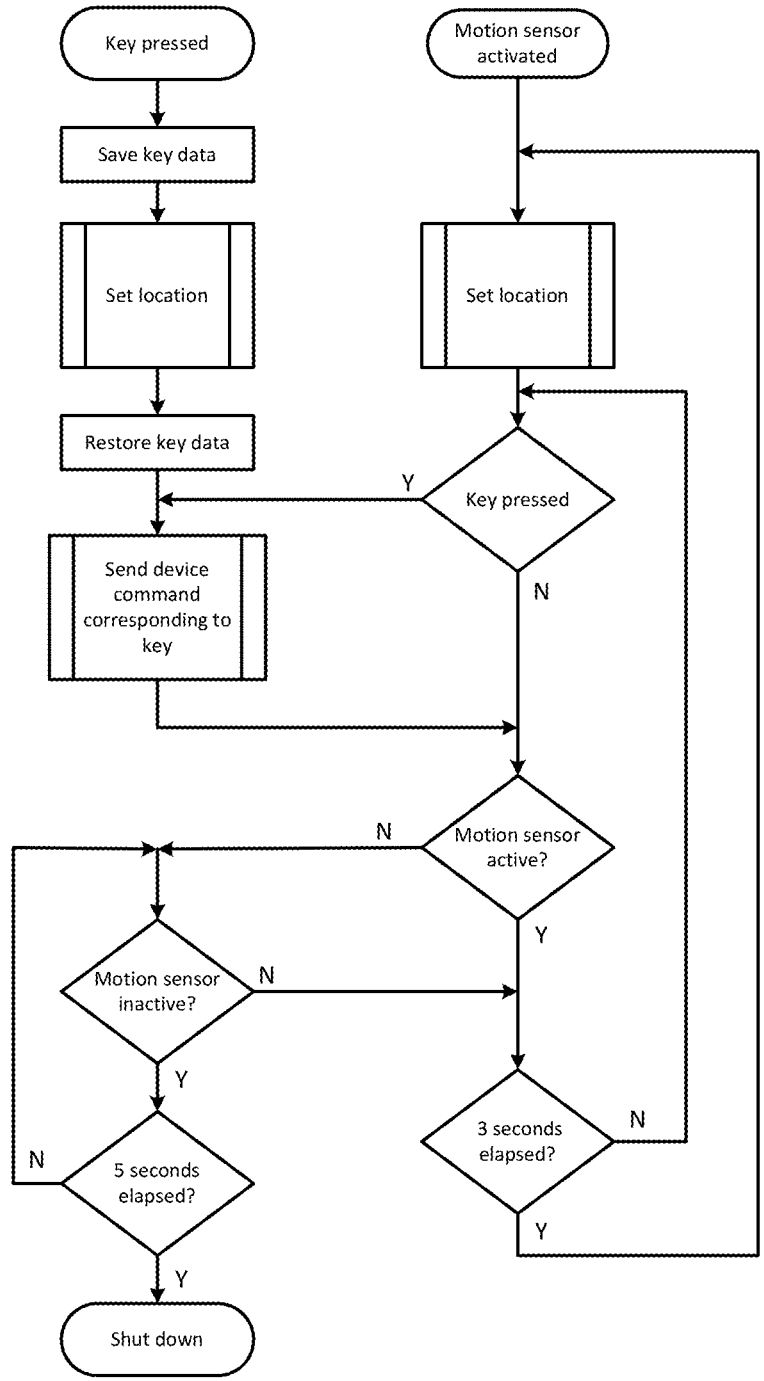
FIGS. 6A and 6B illustrate a flow chart diagram of exemplary steps for determining controlling device position using a signaling device system.
Figure 6B:
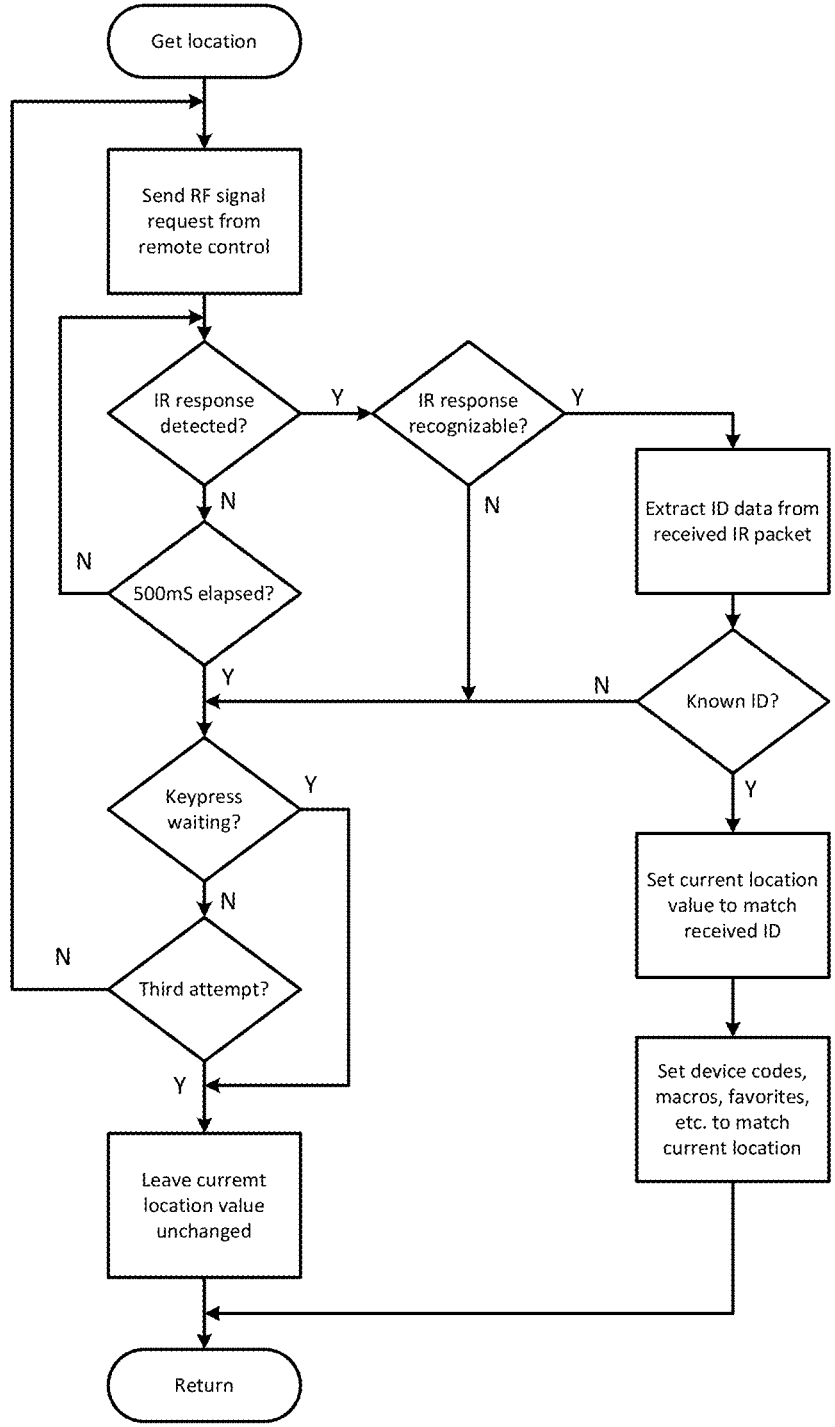

By way of further explanation, the flowcharts of FIGS. 6a and 6b illustrate the processing of the location determination functionality by the controlling device and signaling device(s) firmware program logic in accordance with the current example system. Since the controlling device is a battery-operated device, it is normally in a low-power state and thus the signal request should be initiated by a user action such as picking up the remote (e.g., a sensed movement of a tilt switch) or pressing a button on the remote. To effect this, after a key press, tilt switch activation, etc. following an initial low-power state, the controlling device sends a signal request via the RF link after which time the controlling device waits (listens) for a predetermined period of time to monitor for the resulting signal response from any available signaling devices. If a response is received a determination is made as to the number of received unique IDs (and optionally from which signal type each ID was received). If multiple unique IDs are received such that the controlling device cannot effect a sufficient location determination (or association with appropriate location definitions) the process is iterated a predefined number of times, or for a predefined amount of time, until an appropriate determination can be made based on received ID(s). As described more fully above, alternatively the iterative process used may involve incremental signal strength reduction in either the successive signal requests or signal responses in order to make an appropriate location determination. Once in receipt of an ID which enables a location determination, the controlling device makes use of the location determination to recall command states, macros, and/or other location definitions in order to effect location specific functions. Upon completion of any location specific functions, or alternatively if no signal response is received within the predetermined time, the controlling device may shut down its receiver and return to the low power state. The controlling device may also be configured to prompt the user to relocate the controlling device after several unsuccessful signal requests and initiate a signal request again from the new location in order to make a location determination. It will be appreciated by those skilled in the art that the controlling device may be easily programmed to periodically transmit signal requests to all available signaling devices without any user input in order to enable periodic location determinations for use by the controlling device. For example, in the case of a controlling device which is motion activated such as by a tilt switch or the like, the controlling device may initially determine its location on being first picked up as described above and thereafter, if the motion sensing circuit remains active (i.e., the user is holding or carrying the controlling device) the controlling device may continue to periodically transmit signal requests and re-determine its location. Once the controlling device senses that it has been placed down (e.g., the motion sensing circuit is inactive for predetermined time, such as five seconds) it may return to the low power state pending the next activation of the motion sensor.

It may be desirable to configure the controlling device such that the initial key press (which initiates transmission of the signal request) constitutes a command desired by a user to be sent an appliance. As such the location determination method may be transparent to a user, in that the controlling device may save the user command initially into memory while the location determination is made using the above described method. Once such location determination is made, the controlling device may recall, and then modify and/or reconfigure the initial command (from user key presses), or execute it "as is," based on the location information to effect the desired user command. By way of example only, a user present in one room of a multi-room environment may request an IR based command via button presses on the controlling device which is intended to control an appliance in a different room, out of the effective range of the controlling device in its present location. By saving the initial user command to the memory of the controlling device (or to a memory location accessible by the controlling device, such as a networked computer or device in the environment or an internet based data source), performing the location determination as described above, and when it is determined that the appliance is located in a different room translating the initial command to a command appropriate to bring about the desired effect in the subject appliance (e.g., using the location information of the current invention in conjunction with the system and method of co-pending application entitled "System And Method For Saving And Recalling State Data For Media And Home Appliances" and issuing an RF command addressed to a signaling device 14 co-located with the desired appliance) the user may control the subject appliance without modifying settings on the controlling device prior to issuing the initial command.

Figure 4:
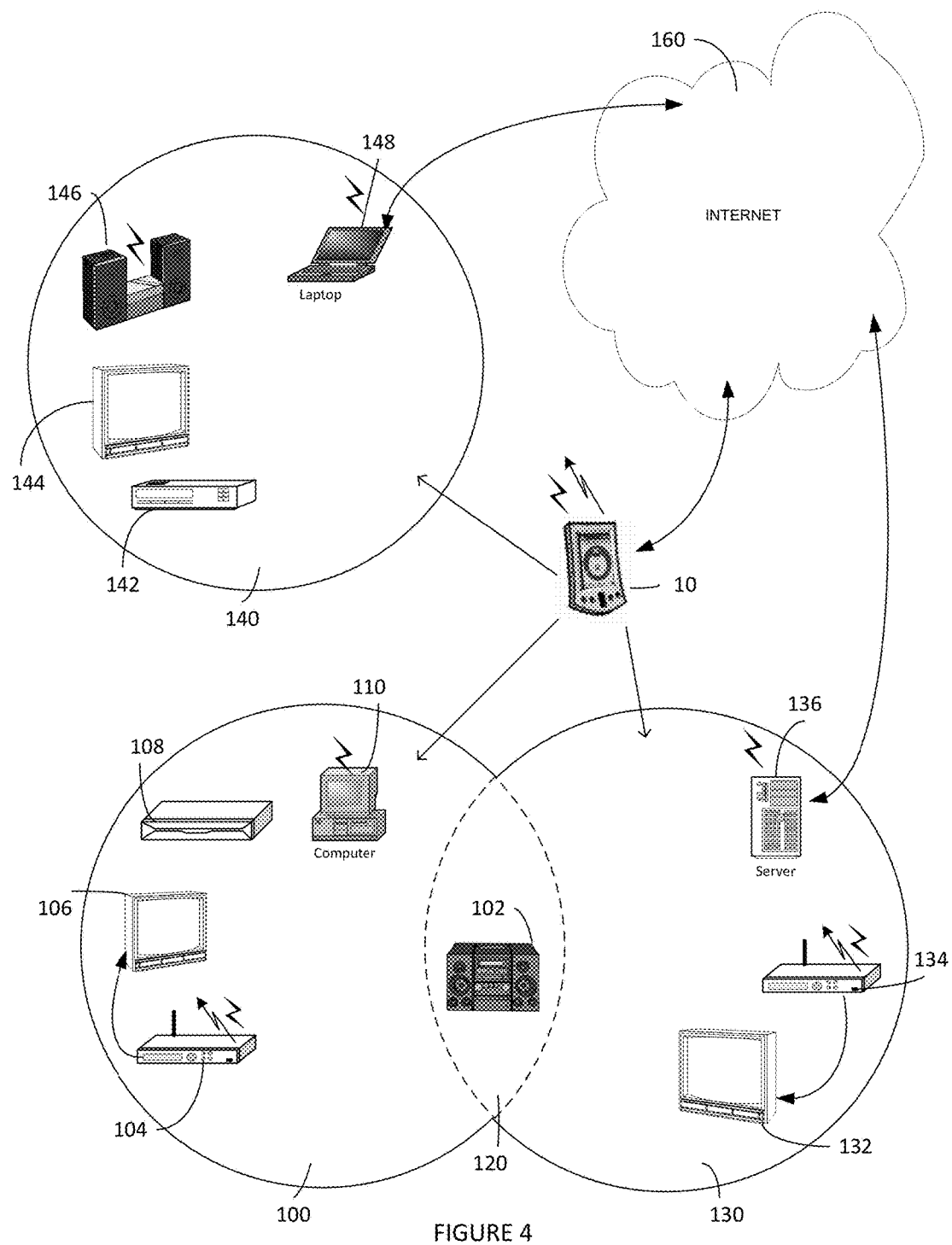
FIG. 4 illustrates another embodiment of the system of the current invention for determining controlling device location using a signal fingerprinting method.

According to another alternate embodiment of the present invention, a location fingerprinting system and method may be used to bring about location based determinations and functions. Looking now to FIG. 4, controlling device 10 may be present in multiple control environments 100, 120, 130, 140, and 160. With respect to each environment, there are multiple home appliances and/or wireless transmitters located within each environment that include wirelessly receivable identifying characteristics (such as network IDs, access point names, appliance addresses, and other wirelessly broadcast information) which may be received and identified by controlling device 10. For example, environment 100 includes wireless access point 104 and wireless enabled computer 110, each of which broadcast unique identifying information in and around environment 100 that may be received and stored by controlling device 10 (for instance in the memory of controlling device 10 or accessible to controlling device 10). Similarly, environment 130 includes wireless access point 134 and wireless enabled server 136, each of which broadcast additional unique identifying information in and around environment 130 that may be received and stored by controlling device 10. Environment 120 does not include any wireless devices broadcasting unique information, however, controlling device 10 may receive the identifying information from both environments 100 and 130 in environment 120, thus enabling a location determination as described in greater detail below. Separate from environments 100, 120, and 130 is environment 140, which includes wireless portable computer 148 and wireless enabled home appliance 146 (e.g., an 802.11 based content renderer), each broadcasting additional unique identifying information in and around environment 140 which may be received and stored by controlling device 10. Environment 160 represents an environment wherein none of the previously described unique identifying information is detected (e.g., any area outside environments 100, 120, 130, and 140 which is Internet accessible), but nonetheless may be used for providing location information (and more appropriately the absence of location information) for purposes of recalling command sets, macros, other dynamic configuration, and/or control features and functions of controlling device 10. To further clarify, in one example system, environments 100, 120 and 130 may represent rooms or other distinct control locations in the same house, while environment 140 represents a distant office. While environment 160 (e.g., any internet accessible location) may be available to controlling device 10 in any of environments 100, 120, 130, and 140, it is characterized as a distinct control environment (such that location definitions, command sets, macros, etc. would be associated with it) by the absence of any detected unique identifying information.

In order to provide the unique identifying information from each environment as location based information to controlling device 10, a database or similar information storage means may be configured in the memory of controlling device 10, or made accessible to controlling device 10 via a home computer or Internet based data source. Each set of unique identifying information, e.g., network addresses from computer 110 and wireless access point 104 for environment 100, may be preconfigured in the database with associated controllable home appliances (as well as their functional abilities and characteristics) 108 and 106. For environment 130, unique identifying information (network addresses) from access point 134 and wireless enabled server 136 is associated with home appliance 132, while for environment 120, home appliance 102 is associated with unique identifying information from all of computer 110, access point 104, access point 134, and server 136. For environment 140, appliances 142, 144, and 146 are all associated with an appliance address from 802.11 based appliance 146 and network address from laptop 148. It will be appreciated that the entirety of a particular network address need not be captured to adequately detect unique identifying information, rather only a fixed portion of such address (i.e., the subnet address in a DHCP addressed environment) need be used. Additionally, a MAC address or other machine or hardware specific names may be used as unique identifying information according to the current system and method. Unique identifying information and other information associated with the various appliances in a control environment may also be dynamically generated based on sensed or received interactions between the controlling device and appliance via advanced control protocols, e.g., UPnP, HAVi, and the like.

Figure 5:
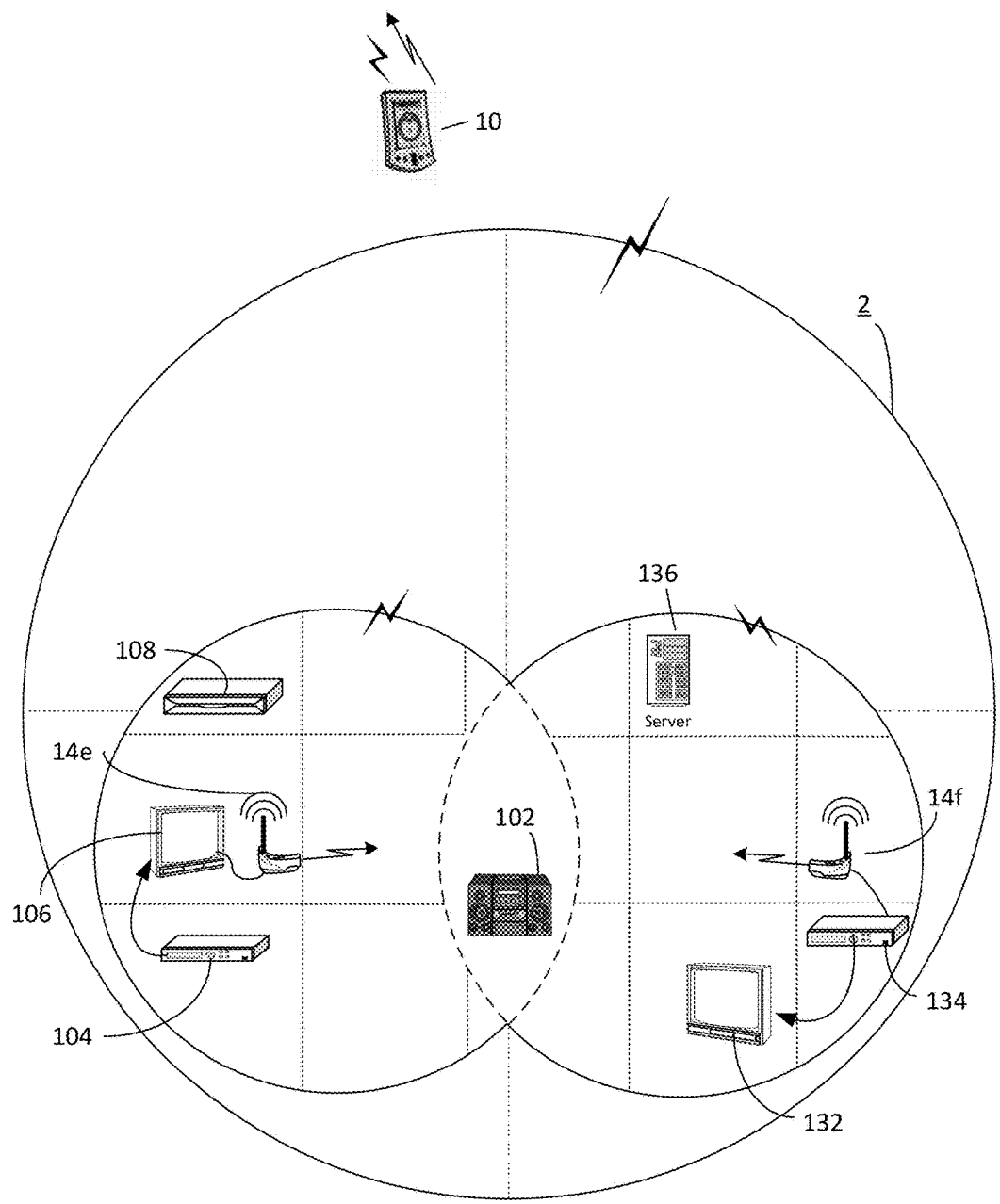
FIG. 5 illustrates another embodiment of the system of the current invention incorporating location signaling devices and signal fingerprinting methods as well as a zone approach to controlling device location determination.

It will also be understood and appreciated that for environments in close proximity, more unique identification information (generally due to the presence of more wireless access points, wireless enabled appliances, wireless computers, etc.) will enable increased levels of location determination accuracy. For example, as illustrated in FIG. 5, signaling devices 14e and 14f may be included and used in conjunction with the current location fingerprinting embodiment in order to enable increased accuracy and location determination resolution. The presence of a signal response from signaling devices 14e and 14f introduces another wireless signal having unique identification characteristics for use with location fingerprinting. Additionally, the IR signal from either signaling device 14e or 14f may serve to provide an initial location determination to controlling device 10 for initiation of certain desired functions, while subsequent location fingerprinting methods provide increased location data to enable additional functions. Still further, well known methods of measuring, storing, and comparing signal strength data from any of the above mentioned sources of unique identifying information (generally the RF based signals from any wireless source able to be received by controlling device 10) may be used to provide in essence a continuum of possible location determinations based on triangulation or other wireless signal based location techniques.

For enabling advanced control functions in controlling device 10, a multi-room environment 2 (as illustrated in FIG. 5) may be configured in a number of distinct control zones, the resolution (amount of spatial area defining the zone) of which is based on signal fingerprint, strength, unique IR signal response from a signaling device, etc. For example large areas of environment 2 having fewer controllable appliances and detectable unique identification signals (and/or signaling devices) may be configured in a larger control zone (based on detected signal fingerprint, strength, etc.) versus areas containing more controllable appliances and detectable unique identification signals.

In one aspect of the present invention, the means for making the location determination comprises machine-readable instructions loaded in the memory of the controlling device, or on a separate home control device (for instance, the hard drive or other non-volatile memory in the case of a media center PC or similar computing based home control device). The machine-readable instructions are capable of performing pre-programmed logic processing on the received signal responses from signaling devices, as well as signals carrying unique identifying information from wireless devices, such that an accurate determination of the location, environment, or zone of the controlling device may be made by reference to the pre-configured location definitions. The software (machine-readable instructions) code to implement such a system is well within the routine skill of a programmer, but may include for instance, reference to the comparative database of location definitions, determinations of signal strength, error detection and correction methods relative the detected signals and stored unique identification data. Additionally, since it is possible that in some instances one or more of the signals (carrying unique identification information used in making location determinations) may not be present (e.g., one or more of the signaling devices, wireless access points, wireless enabled computers, etc. are not powered on, are temporarily attenuated by a structure or obstacle, or have been moved to a different location) the software code may include programming to select the closest match from database comparison operations in order to perform the desired advanced controlling device functions. In the event that a particular signal is found to be persistently absent, the software code may include programming to remove that signal characteristic from the comparative database of location definitions. Similarly, the software code may include programming which, upon detection of the continued presence of a new signal in a location (for example, after having detected it several times in succession over a predetermined period of time) may add the characteristics of that signal to that location's data in the comparative database of location definitions.

Additional device data (e.g., device features, services, states, or other information such as may be provided from a UPnP or HAVi compliant device) may be wirelessly broadcast in the same signal as the signal being provided and used for location determination functions. In this way the controlling device may, from the same wireless data stream, determine its location, the number and type of devices present, devices capabilities, and device states. This information can all be used for both provisioning customized user interfaces on the controlling device, and enabling dynamic/complex macro command generation to accomplish desired user activities. Additionally, the use of predefined or preset location definitions may not be necessary in such a system because all information needed by the controlling device to effect user commands and activities is provided in the location determination signal and associated wireless data transmissions.

For initially setting up the controlling device to make location determinations based on any of the above described systems and methods, the controlling device or associated home control device may include machine readable instructions to prompt a user to set up the controlling device several different times based on the users current environment or zone. For instance, upon setting up a controlling device to control various appliances in a first desired control environment or zone (using any known method as described above), the controlling device may include programming to prompt the user to move to a location in the environment or zone most likely to be used when controlling the associated appliances. Once in this location the user may be prompted by programming in the controlling device to either ensure that a particular IR signal from a signaling device is detectable by the controlling device (the unique ID), or to initiate a location fingerprinting algorithm to be run by the controlling device. Generally the location fingerprinting algorithm will involve detecting and saving unique identification information from wireless signals present in the environment or zone to a database and associating such information with the previously set up appliances in the desired environment or zone according to the above described method. By repeating the above described location based set up method in any number of desired control environments or zones, the controlling device may be programmed with location based data (location definitions) such that subsequent commands issued by the user are able to access and use the location definitions in conjunction with software on the controlling device (or home control device) to enable advanced control features and functions.

In other embodiments, and for enabling additional location and environment based determinations, the system of the present invention may be configured such that the controlling device may become active when the user provides input to the controller. To this effect, after a key press, tilt switch activation, etc. following an initial low-power state, the controlling device may send a location signal or beacon signal via the RF link. The controlling device 10 and associated appliance(s) 12 may execute a cooperative calibration or initial set up procedure to identify the controlling device's location. The cooperative calibration procedure may be executed by the controlling device's 10 software and may include one or more signals and one or more appliance 12 parameters to locate the controlling device 10 (for example, the location signal strength and one or more of a plurality of appliance parameters such as mixed IR/RF location determination systems, signal fingerprint, unique ID, etc.). In addition, it is contemplated that the controlling device 10 may be able to determine its current location using signals received from GPS positioning satellites. Similarly, the software code may include programming which, upon detection of the initiation of the calibration procedure in a new location (for example, after having compared it several times in succession over a predetermined period of time) may add the characteristics of that signal to that location's data in the comparative database of location definitions.

Figure 8:
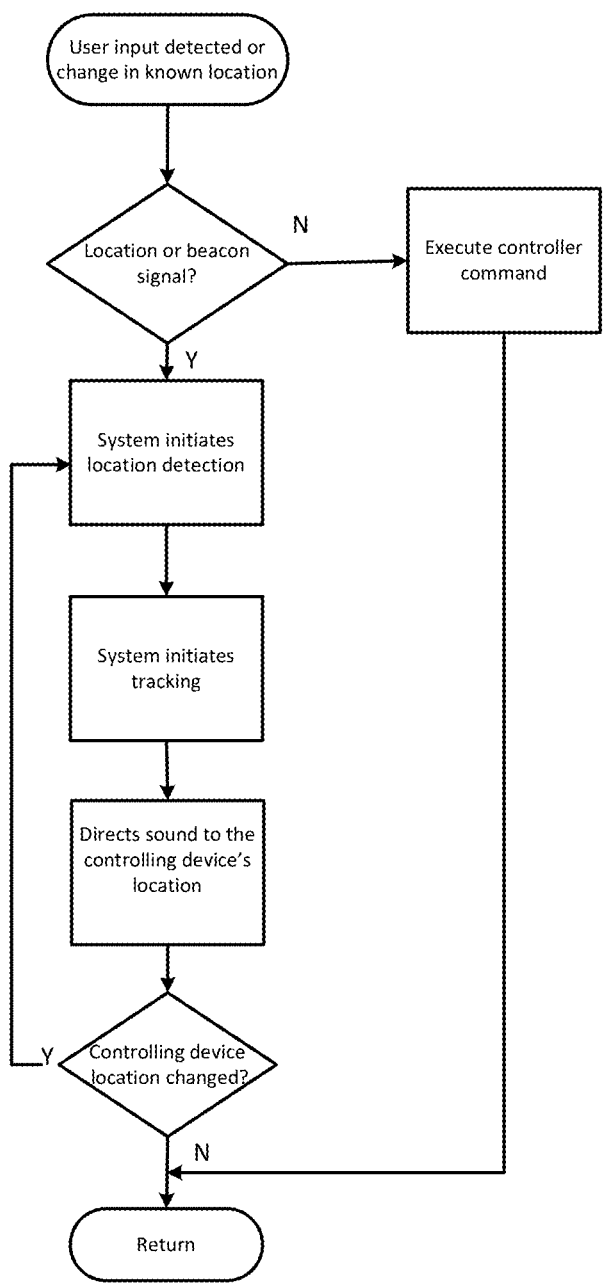
FIG. 8 illustrates a flow chart diagram of an alternate method for determining controlling device position.

As illustrated in FIG. 8, the controlling device 10 may detect input from a user or may detect a change from the controlling device's 10 original or previously identified location.

The user may initiate the location signal at the controlling device or the controlling device may detect that the user has moved the controlling device to a new location which may trigger the controlling device 10 to initiate the location signal to be received by the appliances within the system environment. When the signal is not a location or beacon signal, the controlling device 10 may execute the default commands.

An appliance 12 may continuously monitor for the controlling device's 10 location signal and may initiate a location detection process after the controlling device's location signal is detected. The appliance 12 may initiate processing of the location determination functionality by the appliance's firmware program logic in accordance with the current example system. The appliance 12 may then initiate a location signal tracking process which may be executed periodically or at a predetermined interval (for example, the appliance 12 may be a parabolic speaker system which may be capable of directing sound at the controlling device's 10 location signal or beacon signal and automatically redirect the sound when the controlling device's 10 directional location relative to the appliance 12 changes). When a change in the controlling device's location is detected, the appliance 12 may initiate a location detection process to identify the new location of the controlling device 10. It is additionally contemplated that, when it is detected that the distance between the controlling device 10 and the appliance 12 changes by more than a threshold amount (which may occur together with or apart from a change in direction) the appliance 12 may respond by changing volume, for example by increasing volume in response to an increase in distance between the devices and by decreasing volume in response to a decrease in distance between the devices. Similarly, if the appliance 12 has a display that is capable of being moved, e.g., it has associated motors or the like to change the pitch and/or yaw or the display, a determined change in directional orientation of the device 10 relative to the appliance 12 by more than a threshold amount can likewise be used to cause the display to be reoriented to generally have the center of the display reorient itself towards the device 10.

It will be understood and appreciated by those skilled in the art that although described in terms of a controlling device 10 in the various example systems, the controlling device of the present invention may be any portable device (including but not limited to IR and/or RF based universal remote controls, cordless or cellular portable phones, wireless capable PDAs, Smart Displays, tablet PCs, gesture sensing or voice recognition apparatus, etc.) capable of transmitting and/or receiving location determining information remotely to and from the signaling device 14. Furthermore, complete control of device functionality may be fully achieved in a single device or may be implemented via multiple separate physical devices or software applications (for example, voice or gesture input into a portable device may be transmitted to remotely located specialized processing system to be parsed into commands which are then returned to the portable device and/or various signaling devices 14 for execution.) Likewise, the signaling device 14 of the present invention may be any home control device (including but not limited to STBs, media center PCs, home automation systems, wireless gateways, etc.) capable of receiving and transmitting signals with unique identifying characteristics to the controlling device. Many additional forms and implementations of the controlling device location determination system and method of the present invention could be contemplated for a variety of purposes without departing from the scope and spirit of the current invention.

The system and process of the present invention has been described above in terms of functional modules in block diagram format. It is understood that unless otherwise stated to the contrary herein, one or more functions may be integrated in a single physical device or a software module in a software product, or one or more functions may be implemented in separate physical devices or software modules, without departing from the scope and spirit of the present invention. Ii will also be appreciated that detailed discussion of the actual implementation of each module is not necessary for an enabling understanding of the invention. The actual implementation is well within the routine skill of a programmer and system engineer, given the disclosure herein of the system attributes, functionality, and inter-relationship of the various functional modules in the system. A person skilled in the art, applying ordinary skill can practice the present invention without undue experimentation.

While the invention has been described with respect to the described embodiments in accordance therewith, it will be apparent to those skilled in the art that various modifications and improvements may be made without departing from the scope and spirit of the invention. Accordingly, it is to be understood that the invention is not to be limited by the specific illustrated embodiments.

All patents and applications for patent cited within this document are hereby incorporated by reference in their entirety.

What is claimed is:

1. A method for using a portable controlling device to control a speaker and/or display associated with a controllable audio and/or visual appliance, comprising:
   executing a cooperative calibration procedure on the portable controlling device to provide from the controlling device to the audio and/or visual controllable appliance a first location for the portable controlling device relative to the controllable appliance as determined by the portable controlling device;
   subsequently executing the cooperative calibration procedure on the portable controlling device to provide from the controlling device to the audio and/or visual controllable appliance a second location for the portable controlling device relative to the controllable appliance as determined by the portable controlling device;
   causing the audio and/or visual controllable appliance to compare the provided first location for the portable controlling device relative to the audio and/or visual controllable appliance and the provided second location for the portable controlling device relative to the audio and/or visual controllable appliance; and
   when the comparison performed by the audio and/or visual controllable appliance indicates that the provided second location for the portable controlling device relative to the audio and/or visual controllable appliance and the provided first location for the portable controlling device relative to the audio and/or visual controllable appliance differ by a threshold amount, causing the audio and/or visual controllable appliance to automatically transition itself from a first operational state to a second operational state different than the first operational state wherein the first operational state and the second operational state each correspond to at least one of a direction orientation of the speaker and/or display associated with the audio and/or visual controllable appliance and a volume output level of the speaker associated with the audio and/or visual controllable appliance.

2. The method as recited in claim 1, wherein the cooperative calibration procedure is caused to be executed in response to an activating of an input element of the portable controlling device.

3. The method as recited in claim 1, wherein the cooperative calibration procedure is caused to be executed in response to the portable controlling device sensing that the portable controlling device has been moved.

4. The method as recited in claim 3, wherein an accelerometer a motion sensing circuit of the portable controlling device is used by the portable controlling device to sense if the portable controlling device is being moved.

5. The method as recited in claim 1, wherein the cooperative calibration procedure is caused to be executed in response to the portable controlling device sensing that the portable controlling device has exited a low-power state.

6. The method as recited in claim 1, wherein the audio and/or visual controllable appliance comprises a television.

7. The method as recited in claim 1, wherein the portable controlling device comprises a smart device.

8. The method as recited in claim 1, wherein the cooperative calibration procedure is caused to be executed in response to the portable controlling device receiving a command signal from the audio and/or visual controllable appliance.

9. The method as recited in claim 8, wherein the audio and/or visual controllable appliance is caused to periodically transmit the command signal to the portable controlling device.

* * * * *